(12) United States Patent
Holbrook et al.

(10) Patent No.: US 6,448,163 B1
(45) Date of Patent: Sep. 10, 2002

(54) METHOD FOR FABRICATING T-SHAPED TRANSISTOR GATE

(75) Inventors: Allison Holbrook; Sunny Cherian, both of San Jose; Zoran Krivokapic, Santa Clara, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/636,273

(22) Filed: Aug. 10, 2000

(51) Int. Cl.$^7$ .......................................... H01L 21/3205
(52) U.S. Cl. ........................ 438/585; 438/587; 438/182
(58) Field of Search ................................. 438/579, 574, 438/585, 587, 182

(56) References Cited

U.S. PATENT DOCUMENTS 4,839,304 A * 6/1989 Morikawa
6,239,007 B1 * 5/2001 Wu ............................. 438/585

* cited by examiner

*Primary Examiner*—Long Pham
(74) *Attorney, Agent, or Firm*—Fliesler, Dubb, Meyer & Lovejoy LLP

(57) ABSTRACT

A method of forming a T-shaped gate for a transistor, comprising: defining a base length of the gate by forming a gate stack on a substrate; defining a contact length by forming a layer of nitride on the gate stack; and defining gate height by selectively removing portions of the nitride layer. The method may include the further step of defining a contact height by depositing a conductive layer on said gate stack.

25 Claims, 4 Drawing Sheets

METHOD FOR FABRICATING T-SHAPED TRANSISTOR GATE

BACKGROUND OF THE INVENTION

1. Field of the Invention

The invention relates to a T-shaped gate structure and method for fabrication of transistors which include T-shaped gates.

2. Description of the Related Art

Increasing the density of devices formed in integrated circuits involves a corresponding reduction in the size or scale of the devices. With a reduction in feature size of transistors in integrated circuits, a corresponding reduction in a transistor's gate dimensions gives rise to a number of performance issues for traditional devices. Reducing the conventional gate structure of a transistor can give rise to an increase in parasitic capacitance and a difficulty in contacting the very small gate structures necessary in small-scale devices. These limitations can become a performance limiting factor. To overcome these limitations, T-shaped gates have been proposed. The T-shaped gate is so named because the cross-section of the conductive gate material has a T-shaped appearance, with a base section (closer to the surface of a substrate) having a narrower width than contact section (at the top of the gate, where conductive interconnects engage the gate).

Along with multiple types of T-shaped gate structures, a number of methods have been proposed to form such T-shaped gates. One such method is disclosed in U.S. Pat. No. 5,998,285. The method taught therein seeks to eliminate the use of the traditional reactive ion etching processes to define the gate structure. In particular, a silicon nitride layer and a pad oxide are formed on a silicon substrate after which a BPSG layer is formed and etched back to expose the silicon nitride surface. The silicon nitride is then removed and a first poly layer is provided and planarized. Thereafter, a second polysilicon layer is formed by selective CVD on the first poly layer to achieve a T-shaped gate electrode. This avoids the directional etch (typically RIE) conventionally used to remove portions of the first poly layer to form the gate structure. A second implant is used to provide self-aligned source and drain areas for the transistors.

The aforementioned process, however, and prior art techniques provide no truly effective mechanism for defining all dimensions of the gate cross-section and therefore producing the desired configuration of the device.

SUMMARY OF THE INVENTION

The present invention provides a method for forming a T-shaped gate and a transistor utilizing such gate with the gate having well defined dimensions.

In one aspect, the invention, roughly described, comprises a method of forming a T-shaped gate for a transistor, comprising: defining a base length of the gate by forming a gate stack on a substrate; defining a contact length by forming a layer of nitride on the gate stack; and defining gate height by selectively removing portions of the nitride layer.

In a further aspect, the method includes the further step of defining a contact height by depositing a conductive layer on said gate stack.

In a further aspect, the base length is defined by forming a gate oxide on the surface of the substrate; depositing a layer of polysilicon on the surface of the gate oxide; and selectively etching portions of the polysilicon layer to define said base length.

In still another aspect, the contact length is defined by depositing a protective oxide on the surface of the gate stack having a thickness; and depositing said layer of nitride having a thickness which, when added to the thickness of the oxide layer and doubled, and added to the base length, will equal the contact length of the gate stack.

In yet another aspect, the gate height is defined by depositing a thick oxide on the surface of the nitride layer; polishing the oxide down to the surface of the nitride layer; etching said nitride layer; and depositing a second conductive layer on said gate stack.

In another aspect of the invention, two polysilicon layers are used, one to form the contact length portion of the gate and the other to form the base length portion. In one embodiment, a silicide layer is provided between the layers.

BRIEF DESCRIPTION OF THE DRAWINGS

The invention will be described with respect to the particular embodiments thereof. Other objects, features, and advantages of the invention will become apparent with reference to the specification and drawings in which.

DETAILED DESCRIPTION

Described herein is a T-shaped gate structure having a well-defined and controlled base length, contact length, contact height and "T" height. As used herein, the term "base length" (L1 in FIG. 6A) defines the length of a portion of the gate structure, generally formed of polysilicon, which rests on a gate oxide layer on the surface of a semiconductor substrate, and the portion of the gate extending upward therefrom having the same cross-sectional width. The term "contact length" (L2 in FIG. 6A) is defined as the length of the top of the T-shaped gate portion which is utilized to couple the gate structure to interconnect conductors which in turn connect it to other portions of the integrated circuit to operate the transistor, and the portion of the gate extending downward therefrom having the same cross-sectional width.

The term "contact height" as used herein (L3 in FIG. 6A) is the vertical height of the portion of the T-shaped gate structure having the contact width as defined above. The term "'T' height" (or "gate height") (L4 in FIG. 6B) is defined as the distance of the contact length portion of the gate from the silicon substrate. Each of these particular terms is illustrated in the Figures as described below.

Figure 1:
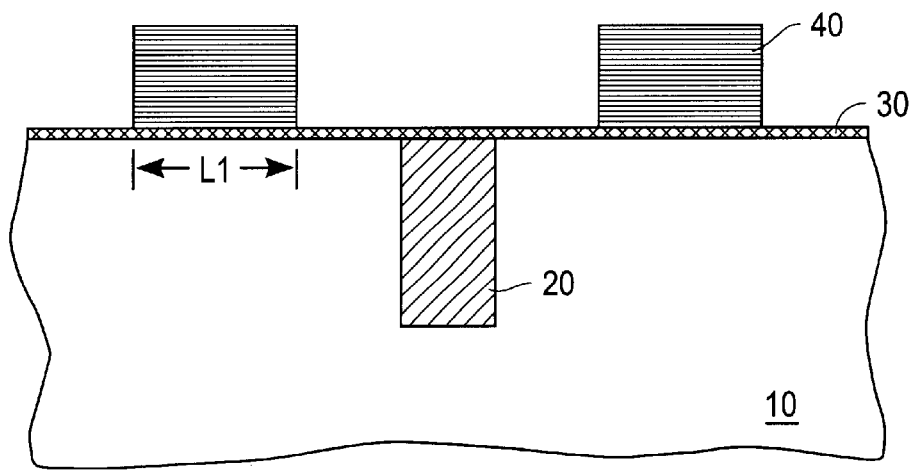
FIG. 1 is a cross-section of a semiconductor device showing the formation of a trench isolation area, gate oxide and first polysilicon layer on a semiconductor substrate.

FIG. 1 shows a cross-section of a semiconductor substrate 10 having formed therein an isolation region 20. Isolation region 20 is shown in FIG. 1 as a trench isolation region having vertical or nearly vertical sidewalls and an isolating material deposited therein. As should be readily recognized, the isolating material filling trench 20 can be a TEOS oxide or any other suitable isolating material including a combination of polysilicon and oxide. It should be further recognized that alternative types of isolation regions 20 may be utilized without departing from the scope and spirit of the present invention, including shallow trench isolation, LOCOS isolation, and the like. Depending on the type of device under construction, well regions may be provided in the substrate adjacent to isolation region 20 prior to formation of the transistors in accordance with well-known techniques.

Following formation of the isolation region 20 and the substrate 10, a gate oxide 30 is formed on the surface of substrate 10. Gate oxide 30 is generally formed by growing an oxide layer on the surface of the substrate 10 by placing the substrate 10 in an oxygen ambient and heating the substrate to provide an oxide layer having a thickness in the range of approximately 10–30 Å.

Following formation of the gate oxide layer 30, a first conductive material such as polysilicon is provided on the surface of gate oxide 30 using any number of well-known techniques such as, for example, chemical vapor deposition. The first conductive material has a thickness of approximately 800–1700 Å. Following deposition, the conductive material is thereafter patterned and etched to form gate stacks 40 having a width L, defining the "base width" of the T-shaped gate formed in accordance with the present invention. The patterning and etching of the first conductive layer to form gate stacks 40 may be performed in accordance with well-known photolithographic and etching techniques. During etching of the first conductive material, portions of the gate oxide not underlying the gate stack will be removed. Portions not fully removed by this etching step may be removed by a subsequent selective wet etch cleaning step.

A protective oxide 42 is thereafter formed on the surface of the gate stacks 42 and gate oxide layer 30. Protective oxide 42 is formed by either a thermal re-oxidation of the first conductive layer and substrate surface, or by depositing a thin layer of un-doped oxide using a conventional oxide deposition process. Protective oxide 42 is utilized to protect the underlying substrate from the implant process utilized to form active regions of the transistor under construction. Following formation of protective oxide 42, doped regions 32 and 34 are formed by implanting an impurity of a conductive type opposite to that of the substrate (of well) into substrate 10, and are self-aligned to gate stack 40. These implants will comprise lightly-doped drain (LDD) implants known to one of average skill in the art and may comprise, by way of example and without limitation, implanting a dopant such as arsenic at an energy of 3–5 KeV or boron ($BF_2$) at an energy of about 7–10 KeV to achieve a doping concentration of approximately $2 \times 10^{14} 1 \times 10^{15}$ atm./cm$^2$. It should be recognized that such implantation need not be performed if, in accordance with the design of the device, LDD regions are not required.

In one embodiment of the present invention, implants for the LDD regions may comprise so-called "halo" implants which are formed by rotating the substrate 10 four times (90°, 180°, and 270° relative to the cross-section of FIGS. 1–6) with an angular, tilted implants having a tilt angle of approximately 20–45° per implant. In a case where four of such implants are used, the deposition dosage may be approximately $4 \times 10^{13}$ for both P- and N-channel devices, with arsenic implanted at energies in a range of approximately 15–35 KeV (for P-channel devices) and for boron at an energy in the range of 5–15 KeV for N-channel devices.

Following implantation of the LDD regions 32 and 34, a silicon nitride layer 45 will be formed over the surface of protective oxide 42, by depositing the nitride using any number of conventional deposition or sputtering techniques to a thickness of 500–900 Å. As will become clear from the subsequent description, the thickness of nitride layer 45 provides the dual function of defining the T-height as well as the contact length portion of the T-shaped gate.

Next, a thick oxide layer 50 is deposited on the surface of nitride layer 45 by, for example, a tetra ethyl orthosilicate (TEOS) deposition process. Layer 45 may be formed to a thickness of 3500–5500 Å in one embodiment. The thick oxide layer 50 will be used in defining the contact length portion of the gate as described below.

Figure 2A:
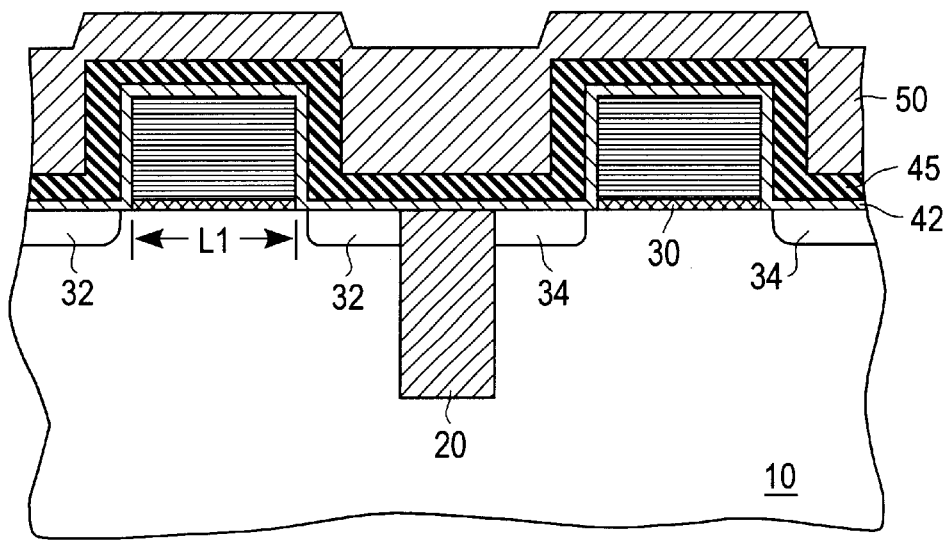
FIG. 2A is a cross-section of the device shown in FIG. 1 further including a protective oxide layer, nitride, and thick oxide layer.
Figure 2B:
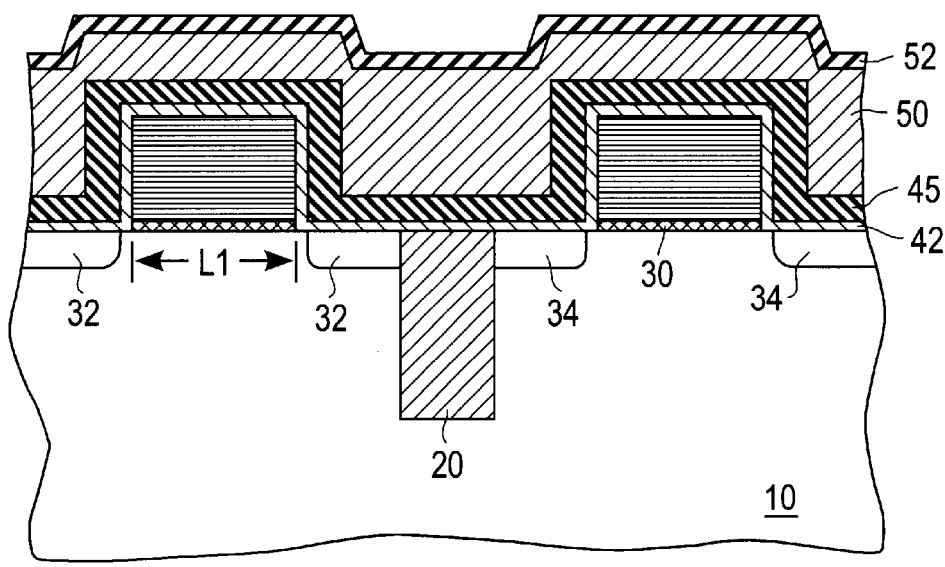
FIG. 2B shows a first alternative to the method of the present invention and the cross-section shown in FIG. 2A wherein a polishing nitride is applied in accordance with the present invention.

Next, a polishing step will be performed to planarize the thick oxide 50 down to the surface of nitride 45. The polishing step may be performed on the device as shown in FIG. 2A, or alternatively, as shown in FIG. 2B, a polishing nitride 52 may be applied to the surface of the thick oxide 50 in order to prevent additional damage to the structure during planarization.

Figure 3:
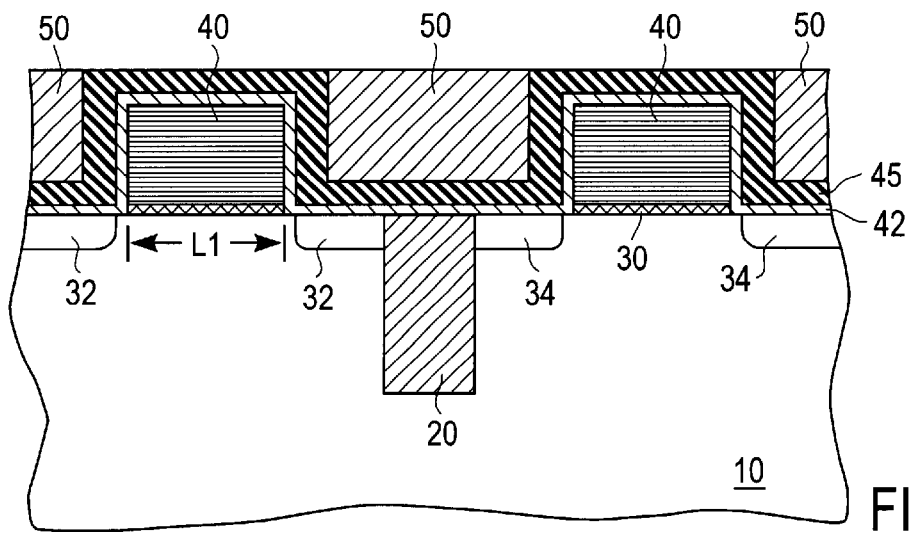
FIG. 3 is a cross-section of the device shown in FIGS. 1, 2A and 2B following the polishing step.

FIG. 3 shows the cross-section of the device following the polishing step. As noted from an examination of the Figures, nitride layer 45 is used as a polish stop layer.

Figure 4A:
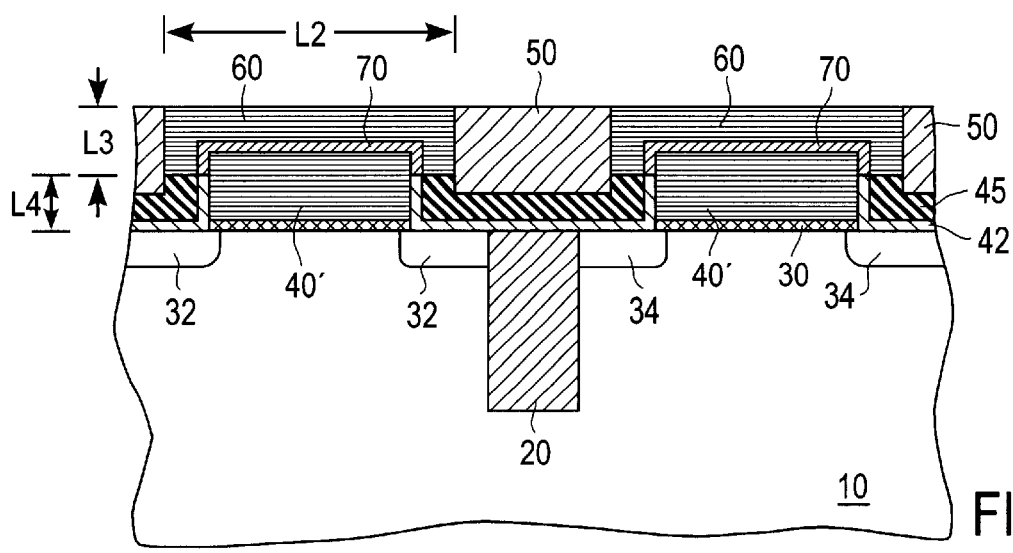
FIG. 4A shows a first alternative of the method of the present invention wherein an intervening silicide layer is utilized in the T-shaped gate of the present invention.

Following planarization, portions of nitride 45 overlying gate stack 40 and exposed by the polishing step are removed by a selective etching process. Removal of the nitride layer 45 will remove portions of the oxide layer 42 and gate stacks 40 leaving lower portions 40' of the gate stack, and voids (shown filled in FIGS. 4A and 4B) where the nitride and oxide layer 42 overlay the gate stacks 40. As shown in FIG. 4A, the thickness of the nitride layer (on both sides of gate 40) coupled with the base width L1 defines the contact thickness L2 of the device. It should be further recognized that the distance between the substrate and the bottom of the contact region can be further defined in accordance with the present invention by defining the etch of the nitride layer 45 and oxide 42.

Figure 4B:
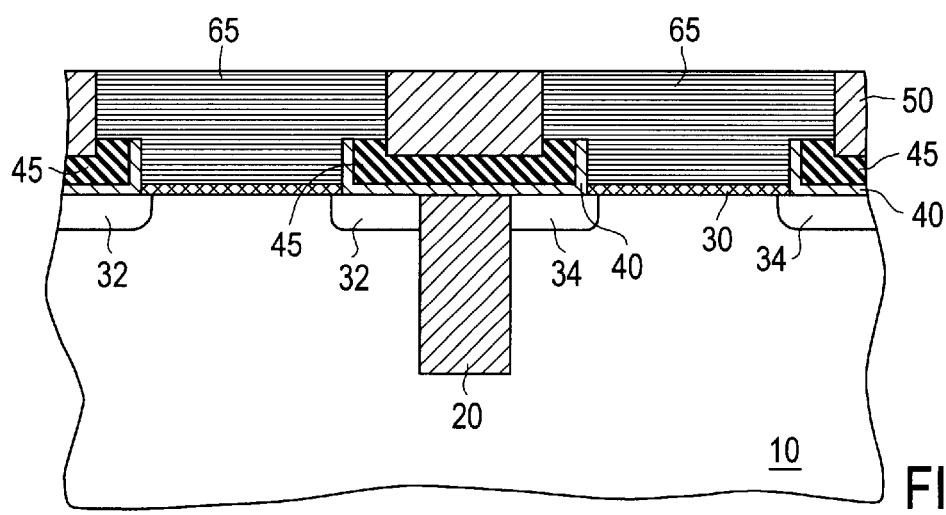
FIG. 4B shows a second alternative of the present invention wherein a second conductive layer is applied directly to the first conductive layer.

FIGS. 4A and 4B show two alternative methods of constructing the T-shaped gate of the present invention following removal of the nitride layer 45. The remaining portions of the gate stacks 40' have an exposed upper surface. In FIG. 4A, a silicide 70 is deposited on stacks 40' in accordance with a first embodiment of the invention. The position of the silicide 70 is followed by the provision of a second conducting layer 60 filling the voids left by etching of the nitride 45 and oxide layer 42. The silicide 70 may comprise a refractory metal silicide such as titanium, tungsten, tantalon or molybdenum acting as an intermediate barrier layer to lower the contact resistance between the contact layers of silicon.

Alternatively, as shown in FIG. 4B, the second conductive layer may be applied directly to the gate stacks 40'.

Subsequently, a second polishing step is utilized to planarize the wafer, utilizing protective oxide 50 as a stop layer for the polishing process. This second planarization step yields the T-shaped gate structures shown in FIGS. 4A and 4B with an intervening silicide (FIG. 4A) or the second poly layer on first poly layer (in FIG. 4B). As shown in FIGS. 4A and 4B, the thickness $L_3$ of the T-shaped gate is defined by the height of the gate 40, the thickness of the nitride layer, and the amount of etch back utilized on the nitride layer 45 and oxide 42.

Figure 5A:
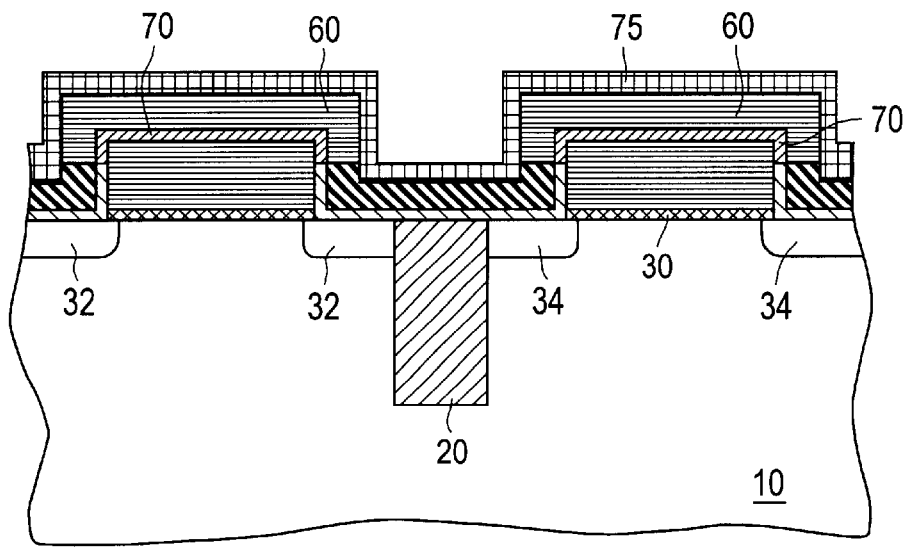
FIG. 5A is a cross-section of the method in accordance with the first alternative of the present invention showing the application of a nitride spacer layer.
Figure 5B:
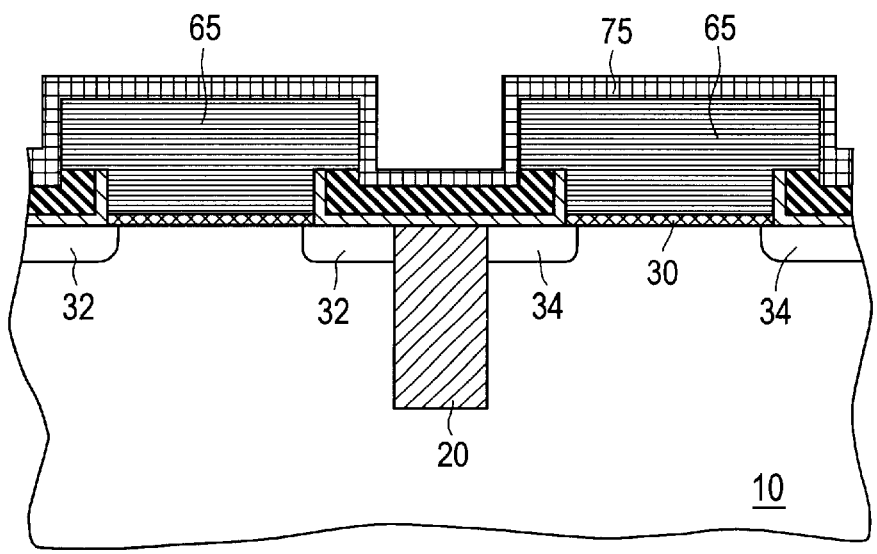
FIG. 5B is a cross-section in accordance with the second embodiment of the method of the present invention showing application of the nitride spacer layer.

Following the second polishing step, a wet etch may be utilized to remove the remaining portions of the oxide layer 50 between polysilicon regions 60 (FIG. 4A) and 65 (FIG. 4B), as shown in FIGS. 5A and 5B, respectively.

Figure 6A:
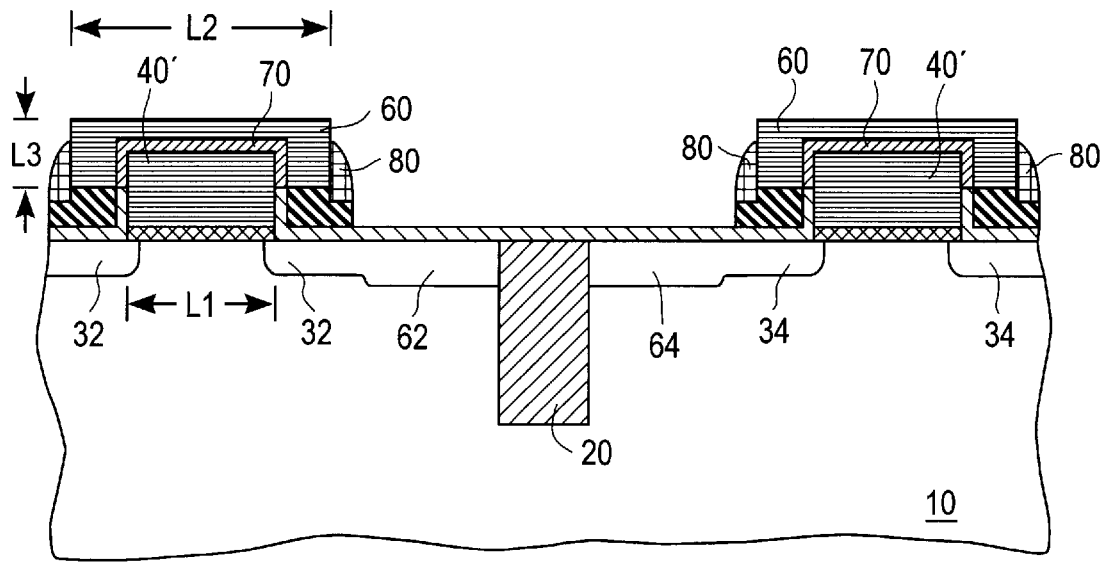
FIG. 6A is a cross-section of the T-shaped gate structure including the etched spacers and source and drain regions formed in accordance with the first alternative of the method of the present invention.
Figure 6B:
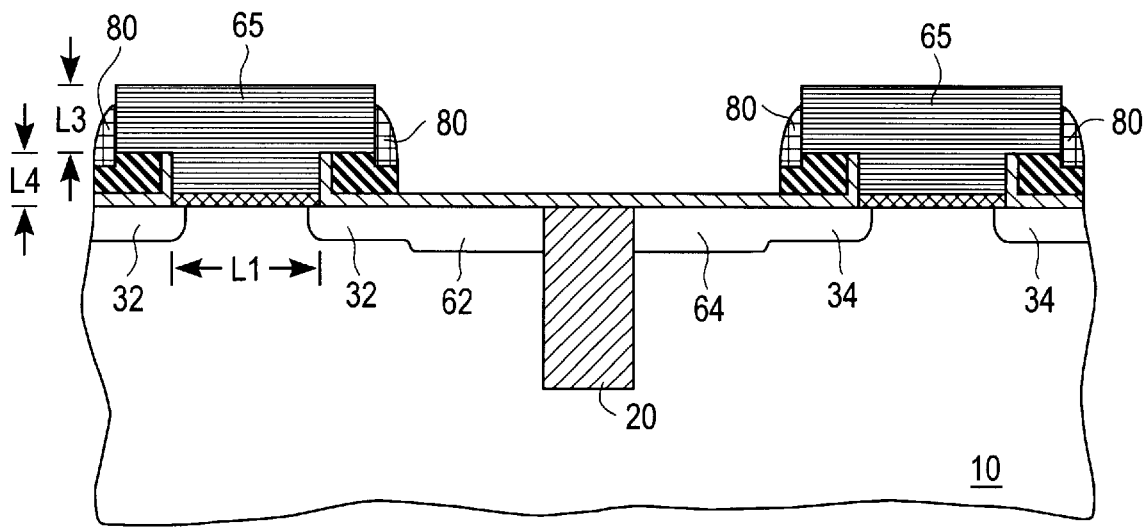
FIG. 6B is a cross-section in accordance with the second alternative of the method of the present invention showing etched spacers, T-shaped gates and the source and drain regions implanted into the substrate.

Once the thick oxide 50 is removed, formation of the transistor may proceed in accordance with known techniques, which include the formation of spacers and source/drain active regions adjacent to the previously formed LDD regions 32,34. FIGS. 5A and 5B show application of a nitride spacer layer 75 deposited on the surface of the T-shaped gates 60 or 65 (the intervening silicide and poly-on-poly embodiments, respectively) of the present invention. Following deposition of the nitride film, a nitride etch is utilized to form spacers 80 as shown in FIGS. 6A and 6B. Notably, the spacer etch will remove portions of nitride 45 remaining between gate 65. Following etch back of the nitride spacers 80, an impurity implant of the same conductivity type as that which formed LDD regions 32,34 is used to form self-aligned source/drain regions 62,64 in substrate 10. Regions 62,64 may be formed by, for example, an arsenic implant at an energy of approximately 15–25 KeV to a doping concentration of 3–4×10$^{15}$ atms./cm$^2$, or a boron implant (BF$^2$) at corresponding energies to reach a concentration of approximately 2×10$^{15}$ atms./cm$^2$. In accordance with the invention, pocket implants having a tilt angle of approximately 20–45° at energies in the range of 10–15 KeV, and each implant having a concentration of approximately 2×10$^{13}$ atms./cm$^2$, may be utilized in conjunction with the rotation of the substrate four times, 90°, 180°, and 270° relative to the position of the cross-section shown in the Figures.

In accordance with the invention, the widths L1 may have a range of approximately 80–150 nanometers, L2 may have a range of approximately 150–250 nanometers, and L3 may have a range of approximately 300–1200 Å.

In yet another alternative of the present invention, regions 40' may be pre-doped to increase their conductivity or resistivity depending on the application. Such pre-doping is effective in the silicided-gate version of the invention shown in FIGS. 4A, 5A and 6A.

The gate structure of the present invention provides a lower overall gate resistance than prior art gate structures, and a larger contact area to the gate structure, since the contact area formed in a t-shape is larger than that which would be utilized in a standard vertical wall gate structure. In addition, fringing fields at the gate-active region (source/drain) interface are reduced as the vertical distance between the contact region and the silicon surface. In addition, a recessed spacer is provided which improves silicidation adjacent to the contact at the contact surface of the t-gate structure. As shown in FIGS. 6A and 6B, spacers 80 do not extend to the top portion of the gate structure, but are recessed.

The device of the present invention can represent a 7–10% improvement in the overlap capacitance between the gate and the source or drain region. This improvement will be dependent on the T-height distance L4 between the base of the contact area and the substrate. Optimum distance for L4 is approximately 200–400 Å.

The many features and advantages of the present invention will be apparent to one of average skill in the art in view of the illustrative embodiments set forth herein. The present invention has been described herein with respect to particular embodiments for a particular applications. It will be apparent to one of average skill in the art that numerous modifications and adaptations of the present invention may be made in accordance with the invention without departing from the spirit of the scope of the invention as disclosed herein and defined by the following claims.

What is claimed is:

1. A method of forming a T-shaped gate for a transistor, comprising:

(a) defining a base length of the gate by forming a gate stack on a substrate;

(b) defining a contact length by forming a layer of nitride on the gate stack;

(c) defining gate height by selectively removing portions of the nitride layer; and wherein said step (b) comprises:

depositing a protective oxide on the surface of the gate stack having a thickness;

depositing said layer of nitride having a thickness which, when added to the thickness of the protective oxide layer and doubled, and added to the base length, will equal the contact length of the gate stack.

2. The method of claim 1 wherein said step (b) further comprises depositing a protective oxide on the surface of the gate stack having a thickness.

3. The method of claim 1 wherein said step (c) comprises:

depositing a thick oxide on the surface of the nitride layer;

polishing the oxide down to the surface of the nitride layer; etching said nitride layer; and depositing a second conductive layer on said gate stack.

4. The method of claim 3 wherein said step (c) further includes:

polishing the second conductive layer; and selectively removing said thick oxide layer.

5. The method of claim 3 wherein said step (c) further comprises the step of:

depositing a nitride layer prior to said step of depositing a second conductive layer on said gate stack.

6. A method of forming a T-shaped gate for a transistor, the T-shaped gate having a base width L1, a contact width L2 and a contact height L3, comprising:

(a) forming a first gate stack comprising a conductive material on a substrate having a width L1;

(b) depositing a nitride layer on the gate stack to define said contact width L2;

(c) depositing an oxide over the nitride layer;

(d) removing the nitride layer to define said gate height L3; and further including the steps, between said steps (a) and (b), of:

(a1) depositing a protective oxide layer on the substrate and the gate stack; and (a2) implanting an impurity into the substrate through said protective oxide layer.

7. The method of claim 6 wherein said oxide deposited in step (c) has a thickness of approximately 3.5K Å–5.5K Å.

8. The method of claim 6 wherein said step (d) comprises selectively etching the nitride layer and at least a portion of said first gate stack to remove said nitride layer without removing said oxide layer deposited in step (c).

9. The method of claim 6 further including the step of:
(e) depositing a silicide layer on the surface of said gate stack.

10. A method of forming a T-shaped gate for a transistor, the T-shaped gate having a base width L1, a contact width L2 and a contact height L3, comprising:
(a) forming a first gate stack comprising a conductive material on a substrate having a width L1;
(b) depositing a nitride layer on the gate stack to define said contact width L2;
(c) depositing an oxide over the nitride layer;
(d) removing the nitride layer to define said gate height L3;
(e) depositing a silicide layer on the surface of said gate stack; and
(f) depositing a second layer of said conductive material on said silicide.

11. A method of forming a T-shaped gate for a transistor, the T-shaped gate having a base width L1, a contact width L2 and a contact height L3, comprising:
(a) forming a first gate stack comprising a conductive material on a substrate having a width L1;
(b) depositing a nitride layer on the gate stack to define said contact width L2;
(c) depositing an oxide over the nitride layer;
(d) removing the nitride layer to define said gate height L3; and
(e) depositing a second layer of said conductive material on said silicide.

12. A method for forming a gate on a substrate, comprising the steps of:
(a) depositing a first polysilicon layer on the substrate;
(b) selectively removing portions of said first polysilicon layer to form gate stacks;
(c) forming a nitride layer on said substrate and said gate stacks;
(d) depositing a thick oxide layer on said nitride layer;
(e) polishing said thick oxide layer to said nitride layer;
(f) selectively removing the nitride layer exposing portions of said gate stacks;
(g) depositing a second conductive layer on said gate stacks;
(h) polishing the second conductive layer to form a planar surface; and further including the steps, between steps (b) and (c), of:
(b1) depositing a protective oxide layer on the surface of the substrate and the gate stacks; and
(b2) implanting an impurity into the substrate to form impurity regions adjacent to the gate stacks.

13. The method of claim 12 wherein said protective oxide has a thickness of between 100–150 Å.

14. The method of claim 12 wherein said nitride layer has a thickness of approximately 500–900 Å.

15. The method of claim 14 wherein said step (d) comprises depositing a TEOS layer to a thickness of between 3.5K Å–5.5K Å.

16. The method of claim 12 wherein said step (f) comprises selectively etching the nitride layer and portions of said gate stacks.

17. The method of claim 12 wherein said method further includes the step, between said steps (f) and (g), of:
depositing a silicide on said gate stack.

18. A method for forming a gate on a substrate, comprising the steps of:
(a) depositing a first polysilicon layer on the substrate;
(b) selectively removing portions of said first polysilicon layer to form gate stacks;
(c) forming a nitride layer on said substrate and said gate stacks;
(d) depositing a thick oxide layer on said nitride layer;
(e) polishing said thick oxide layer to said nitride layer;
(f) selectively removing the nitride layer exposing portions of said gate stacks;
(g) depositing a second conductive layer on said gate stacks;
(h) polishing the second conductive layer to form a planar surface;
(i) removing the thick oxide layer;
(j) depositing a nitride spacer layer on said substrate;
(k) etching the nitride spacer layer and the nitride layer; and
(l) implanting a second impurity into the substrate to form source and drain regions for the transistor.

19. A method for forming a transistor, comprising the steps of:
(a) providing a substrate;
(b) forming a gate oxide on the substrate;
(c) depositing a first conductive layer on a portion of the gate oxide;
(d) forming a protecting oxide layer on the first conductive layer and a portion of the substrate;
(e) implanting a first impurity into the substrate through the oxide layer;
(f) forming a nitride layer on said protecting oxide layer;
(g) depositing a thick oxide layer on said nitride layer;
(h) polishing said thick oxide layer to said nitride layer;
(i) removing a portion of the nitride layer;
(j) depositing a second conductive layer in the void of the removed portion of the nitride layer and on a portion of the thick oxide layer;
(k) polishing the second conductive layer to form a planar surface;
(l) etching the thick oxide;
(m) depositing a nitride spacer layer on a portion of the second conductive layer and on a portion of the nitride layer;
(n) forming nitride spacers from said nitride spacer layer, said nitride spacers formed at the edges of the portion of the second conductive layer; and
(o) implanting a second impurity into the substrate to form self aligned junction regions.

20. The method of claim 1 further including the step (d) of:
defining a contact height by depositing a conductive layer on said gate stack.

21. The method of claim 1 wherein said step (a) comprises:
forming a gate oxide on the surface of the substrate;
depositing a layer of polysilicon on the surface of the gate oxide; and
selectively etching portions of the polysilicon layer to define said base length.

22. The method of claim 6 wherein said step (a) comprises the sub-steps of:
   depositing a conductive material on the substrate;
   selectively removing portions of the conductive material to define said first gate stack at said width L1.

23. The method of claim 1 wherein said nitride layer has a thickness in a range of about 500–900 Å.

24. The method of claim 12 further including the step, prior to step (a), of depositing a gate oxide on the surface of the substrate.

25. The method of claim 12 wherein said gate oxide has a thickness of approximately 10–30 Å.

* * * * *